(12) United States Patent
Grau Besoli et al.

(10) Patent No.: US 9,793,963 B2
(45) Date of Patent: Oct. 17, 2017

(54) INTEGRATED CIRCUIT WITH ANTENNA ARRAYS AND METHODS FOR USE THEREWITH

(71) Applicant: BROADCOM CORPORATION, Irvine, CA (US)

(72) Inventors: Alfred Grau Besoli, Barcelona (ES); Nicolaos Georgiou Alexopoulos, Irvine, CA (US); Jesus Alfonso Castaneda, Los Angeles, CA (US); Chryssoula Angelakis Kyriazidou, Kifisia (GR)

(73) Assignee: AVAGO TECHNOLOGIES GENERAL IP (SINGAPORE) PTE., Singapore (SG)

(*) Notice: Subject to any disclaimer, the term of this patent is extended or adjusted under 35 U.S.C. 154(b) by 217 days.

(21) Appl. No.: 14/552,831

(22) Filed: Nov. 25, 2014

(65) Prior Publication Data
US 2015/0148098 A1 May 28, 2015

Related U.S. Application Data

(60) Provisional application No. 61/909,773, filed on Nov. 27, 2013.

(51) Int. Cl.
*H04M 1/00* (2006.01)
*H04B 7/0404* (2017.01)
(Continued)

(52) U.S. Cl.
CPC .......... *H04B 7/0404* (2013.01); *H01Q 1/007* (2013.01); *H01Q 1/2291* (2013.01); *H01Q 3/26* (2013.01);
(Continued)

(58) Field of Classification Search
CPC .... H04B 7/0404; H04B 7/0617; H04B 7/086; H01Q 1/007; H01Q 1/2291; H01Q 3/26;
(Continued)

(56) References Cited

U.S. PATENT DOCUMENTS

| | | | |
|---|---|---|---|
| 2004/0046694 A1* | 3/2004 | Chiang et al. | 342/360 |
| 2004/0110469 A1* | 6/2004 | Judd et al. | 455/15 |
| 2012/0077447 A1* | 3/2012 | Rofougaran | 455/73 |

* cited by examiner

*Primary Examiner* — Keith Fang
(74) *Attorney, Agent, or Firm* — Garlick & Markison; Bruce E. Stuckman (57) ABSTRACT

Aspects of the subject disclosure may include, for example, an integrated circuit that includes at least one die having transceiver circuitry that generates outbound signals that convey outbound data and that receives inbound signals that convey inbound data. A first array of antenna elements arranged along the top portion of the IC package operate in conjunction with the transceiver circuitry to transmit at least a first portion of the outbound signals as first wireless transmissions and/or generate at least a first portion of the inbound signals from first wireless receptions. A second array of antenna elements arranged along the bottom portion of the IC package operate in conjunction with the transceiver circuitry to transmit at least a second portion of the outbound signals as second wireless transmissions and/or to generate at least a second portion of the inbound signals from second wireless receptions. Other embodiments are disclosed.

20 Claims, 7 Drawing Sheets

(51) Int. Cl.
*H04B 7/06* (2006.01)
*H04B 7/08* (2006.01)
*H01Q 1/00* (2006.01)
*H01Q 1/22* (2006.01)
*H01Q 3/26* (2006.01)
*H01Q 9/20* (2006.01)
*H01Q 21/06* (2006.01)
*H01Q 21/20* (2006.01)
*H01Q 21/28* (2006.01)
*H01Q 21/29* (2006.01)
*H01Q 25/00* (2006.01)

(52) U.S. Cl.
CPC ............. *H01Q 9/20* (2013.01); *H01Q 21/065* (2013.01); *H01Q 21/205* (2013.01); *H01Q 21/28* (2013.01); *H01Q 21/293* (2013.01); *H01Q 25/00* (2013.01); *H04B 7/0617* (2013.01); *H04B 7/086* (2013.01); *H01L 2223/6677* (2013.01); *H01L 2224/16227* (2013.01); *H01L 2924/15192* (2013.01)

(58) Field of Classification Search
CPC ...... H01Q 9/20; H01Q 21/065; H01Q 21/205; H01Q 21/28; H01Q 21/293; H01Q 25/00
See application file for complete search history.

INTEGRATED CIRCUIT WITH ANTENNA ARRAYS AND METHODS FOR USE THEREWITH

CROSS REFERENCE TO RELATED PATENTS

The present application claims priority under 35 USC 119 to the provisionally filed U.S. Application entitled, MMW ANTENNA STRUCTURES AND APPLICATIONS THEREOF, having Ser. No. 61/909,773, and filed on Nov. 27, 2013, the contents of which are expressly incorporated herein in their entirety by reference for any and all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND

Technical Field

This disclosure relates generally to wireless communication systems and more particularly to antenna structures used in such wireless communication systems.

Description of Related Art

Communication systems are known to support wireless and wire lined communications between wireless and/or wire lined communication devices. Such communication systems range from national and/or international cellular telephone systems to the Internet to point-to-point in-home wireless networks to radio frequency identification (RFID) systems to radio frequency radar systems. Each type of communication system is constructed, and hence operates, in accordance with one or more communication standards. For instance, radio frequency (RF) wireless communication systems may operate in accordance with one or more standards including, but not limited to, RFID, IEEE 802.11, Bluetooth, global system for mobile communications (GSM), code division multiple access (CDMA), WCDMA, local multi-point distribution systems (LMDS), multi-channel-multi-point distribution systems (MMDS), LTE, WiMAX, and/or variations thereof.

For an RF wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). The receiver is coupled to the antenna and includes a low noise amplifier, one or more intermediate frequency stages, a filtering stage, and a data recovery stage. The transmitter includes a data modulation stage, one or more intermediate frequency stages, and a power amplifier, which is coupled to the antenna.

Since a wireless communication begins and ends with the antenna, a properly designed antenna structure is an important component of wireless communication devices. As is known, the antenna structure is designed to have a desired impedance (e.g., 50 Ohms) at an operating frequency, a desired bandwidth centered at the desired operating frequency, and a desired length (e.g., ¼ wavelength of the operating frequency for a monopole antenna). As is further known, the antenna structure may include a single monopole or dipole antenna, a diversity antenna structure, an antenna array having the same polarization, an antenna array having different polarization, and/or any number of other electromagnetic properties.

Two-dimensional antennas are known to include a meandering pattern or a micro strip configuration. For efficient antenna operation, the length of an antenna should be ¼ wavelength for a monopole antenna and ½ wavelength for a dipole antenna, where the wavelength $(\lambda)=c/f$, where c is the speed of light and f is frequency. For example, a ¼ wavelength antenna at 900 MHz has a total length of approximately 8.3 centimeters (i.e., $0.25*(3\times10^8$ m/s)/(900× $10^6$ c/s)=0.25*33 cm, where m/s is meters per second and c/s is cycles per second). As another example, a ¼ wavelength antenna at 2400 MHz has a total length of approximately 3.1 cm (i.e., $0.25*(3\times10^8$ m/s)/($2.4\times10^9$ c/s)=0.25*12.5 cm).

DETAILED DESCRIPTION

With 60 GHz wireless systems, often there is no clear line-of-sight between a transmitter and a receiver of the wireless systems, which may cause a reduction in quality and reliability of a wireless link. The interior of buildings, for example, include many obstacles to the wireless signals, such as walls, partitions, ceilings, and furnishings, which are surfaces to reflect the signals. Each bounce can introduce phase shifts, time delays, attenuations, and distortions that can interfere with one another at the receiving antenna.

An integrated circuit antenna is presented that includes a bidirectional antenna array capable of radiating and scanning (transmitting and receiving) from the two or more different directions, such as the front and back of the integrated circuit package. Such an antenna allows endpoints to communicate wirelessly in the V-band of 57-62

GHz, such as using the IEEE 802.15.3 and 802.15.4 standards, according to the WLAN and WPAN 60 GHz band specifications, at other frequencies in the millimeter wave band of 30 GHz-300 GHz or according to other wireless standards in accordance with other microwave or radio frequency bands.

Figure 1:
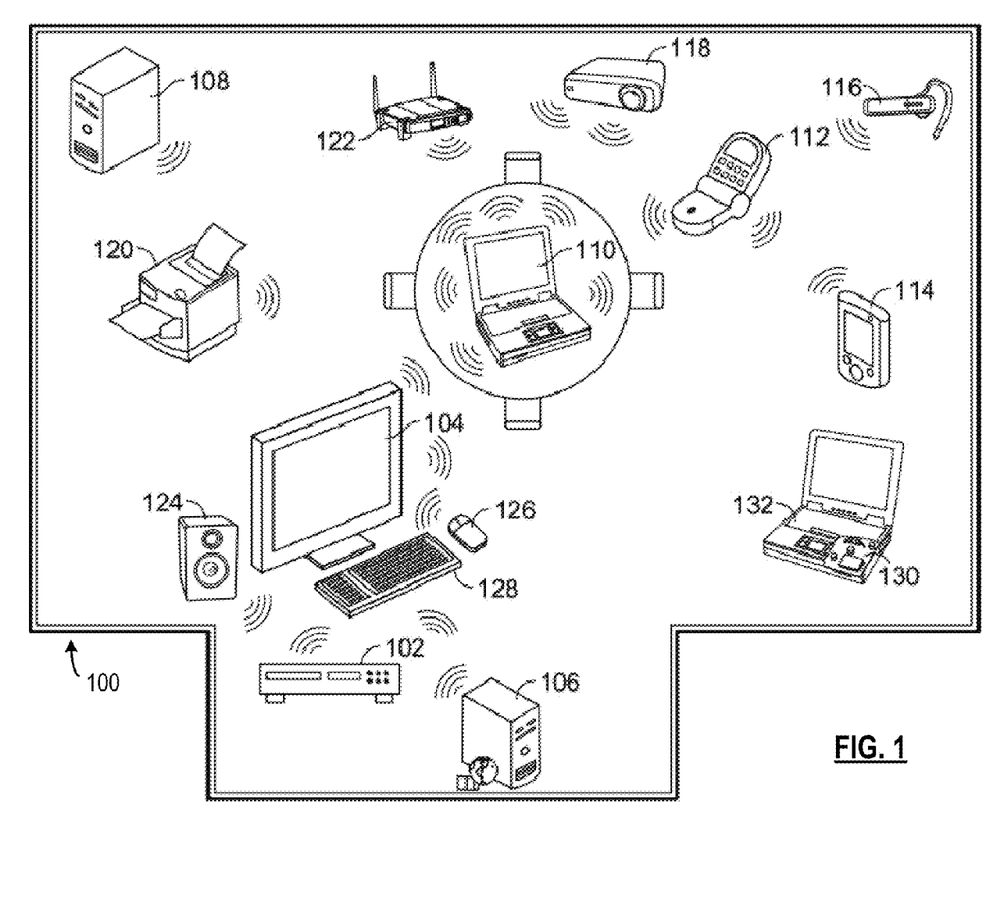
FIG. 1 presents a pictorial diagram of an example of a communication environment in accordance with the present disclosure.

FIG. 1 presents a pictorial diagram of an example of a communication environment in accordance with the present disclosure. In general, devices are shown that each include an antenna that functions with a transmitter (TX) and a receiver (RX) (e.g., transceiver), to provide a communication link between the endpoints. Endpoints may be found in various contexts, including the home, business, public spaces and automobile. In this example, the environment 100 is a room. The environment 100 includes multiple endpoints that may communicate wirelessly with some or all the other endpoints. In FIG. 1, a media player 102 (e.g., a Blu-Ray player or streaming media player) streams high definition video and audio content to a television (TV) 104. Similarly, a home media server 106 with a wireless network interface streams audio (e.g., MP3 content) and video (e.g., MP4, AVI, or MPEG content) to the TV 104 and to other endpoints in the environment 100.

Other examples of endpoints in the environment 100 include an application and file server 108 that is in communication with the laptop computer 110. Additional or alternative computing devices may be present in the environment 100 such as desktop and tablet computers, which may also act as endpoints. The laptop computer 110 wirelessly communicates with peripheral devices, such as a projector 118 and a printer 120. The media player 102 is also shown wirelessly communicating with the projector 118. The laptop computer 110 may also wirelessly exchange information with other endpoints such as a gateway or network router 122.

In FIG. 1, a cell phone, personal digital assistant, tablet, phablet, portable email device or smartphone 112 and a portable gaming system 114 wirelessly exchange information (e.g., emails, text messages or video game saved game files). The smartphone 112 may also wirelessly connect to a radio receiver or other audio device such as earpiece 116. Other endpoints may exist in the environment 100, and different environments may include additional, fewer, or different endpoints. For example, the environment 100 may include stereo equipment, amplifiers, pre-amplifiers and tuners that wirelessly connect to each other and other endpoints in the room. Speaker 124 is shown wirelessly receiving audio signals from TV 104 to output sound from the TV.

Other examples of endpoints include musical instruments, microphones, climate control systems, intrusion alarms, audio/video surveillance or security equipment, network attached storage, pet tracking collars, or other devices. As additional examples, endpoints may further include automobiles, audio head ends or DVD players, satellite music transceivers, noise cancellation systems, voice recognition systems, navigation systems, alarm systems, engine computer systems, or other devices.

Computer components themselves may be wirelessly connected endpoints such that memory, mass storage devices (e.g., disk drive, tape drive), input devices (e.g. keyboard 128, mouse 126), output devices (e.g., display screen, printer 120) and central processing units may be the endpoints. Mouse 126 and keyboard 128 are shown wirelessly connecting with a display screen or TV 104. Endpoints may also include components or modules that make up the computing devices, such as circuitry, electronics, semiconductors, processing units, microelectronic circuits, etc. (e.g., computer components 130 shown in the cutaway view of a laptop 132).

While the forgoing has focused on a home environment, features of the present disclose disclosure can be applied in other environments such as an automotive network or other automotive environment, an office environment, an urban or other public space, a 5G wireless network environment or other wireless network.

Figure 2:
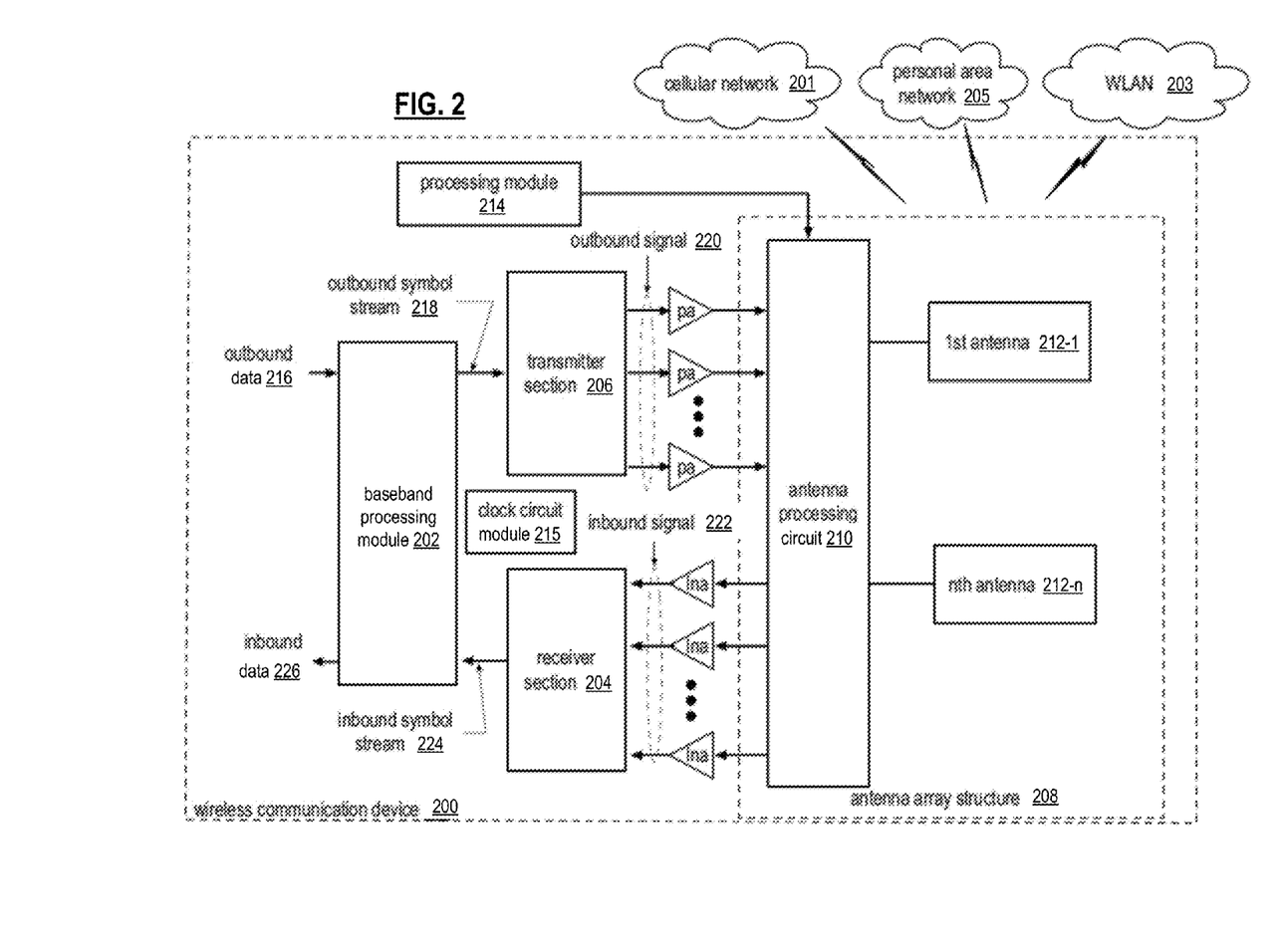
FIG. 2 is a schematic block diagram of an example of a wireless communication device in accordance with the present disclosure.

FIG. 2 is a schematic block diagram of an example of a wireless communication device in accordance with the present disclosure. Wireless communication device 200 may be any device that can be carried by a person, can be at least partially powered by a battery or other electrical storage, includes a radio transceiver (e.g., radio frequency (RF), microwave and/or millimeter wave (MMW) transceiver) and performs one or more software applications. For example, the wireless communication device 200 may be a smartphone 112, a laptop computer 110, any of the other devices described in conjunction with communication environment 100 or other wireless device. The wireless communication device 200 may communicate via the cellular network 201, a personal area network 205 (2.4 GHz, 60 GHz, etc), and/or the wireless local area network (WLAN) network 203 in accordance with one or more cellular and/or WLAN protocols.

The wireless communication device 200 includes a baseband processing module 202, a receiver section 204, a plurality of low noise amplifiers, a transmitter section 206, a plurality of power amplifiers, a processing module 214, and an antenna array structure 208. The antenna array structure 208 includes an antenna processing circuit 210, and a plurality of antennas 212-1 through 212-$n$ that make up an antenna array. The antennas may be implemented as discussed below.

In an example of transmitting an outbound signal 220, the baseband processing module 202 converts outbound data 216 (e.g., voice, text, video, graphics, video file, audio file, etc.) into a outbound symbol stream 218 in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), IEEE 802.15.3 or 802.15.4 standards, WLAN and WPAN 60 GHz band specifications, or other wireless standard). Such a conversion includes one or more of: scrambling, puncturing, encoding, interleaving, constellation mapping, modulation, frequency spreading, frequency hopping, beamforming, space-time-block encoding, space-frequency-block encoding, frequency to time domain conversion, and/or digital baseband to intermediate frequency conversion. Note that the baseband processing module 202 converts the outbound data 216 into a single outbound symbol stream 218 for Single Input Single Output (SISO) communications and/or for Multiple Input Single Output (MISO) communications and converts the outbound data 216 into multiple outbound symbol streams 218 for Single Input Multiple Output (SIMO) and Multiple Input Multiple Output (MIMO) communications.

The transmitter section 206 converts the outbound symbol stream 218 into one or more outbound signals 220. The power amplifiers amplify the one or more outbound signals 220 (e.g., signals in one or more frequency bands 800 MHz, 2800 MHz, 2900 MHz, 2000 MHz, 2.4 GHz, 5 GHz, 60 GHz, etc.). The antenna processing circuit 210 receives the one or more outbound signals 220 and couples them to the antennas in a variety of ways based on various operational modes. For instance, the antenna processing circuit 210 is able to couple for multiple input multiple output (MIMO) operation, diversity antenna operation, and/or both MIMO and diversity antenna operations in accordance with one or more selectable MISO, SISO, SIMO or MIMO modes of operation. The antenna processing circuit 210 sends the one or more outbound signals 220 to the antennas 212-1 through 212-n for transmission via one or more channels of interest.

In an example of receiving an inbound signal 222, the antennas 212-1 through 212-n receive the one or more inbound signals 222 and provides them to the antenna processing circuit 210. The antenna processing circuit 210 couples the signals to the low noise amplifiers in a variety of ways based on various operational modes. The low noise amplifiers amplify the one or more inbound signals 222 and provide them to the receiver section 204. The receiver section 204 converts the one or more inbound signal 222 into one or more inbound symbol streams 224.

The baseband processing module 202 converts the inbound symbol stream(s) 224 into inbound data 226 (e.g., voice, text, audio, video, graphics, etc.) in accordance with one or more wireless communication standards. Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling. Note that the processing module 202 converts a single inbound symbol stream 224 into the inbound data 226 for Single Input Single Output (SISO) communications and/or for Multiple Input Single Output (MISO) communications and converts multiple inbound symbol streams 224 into the inbound data 226 for Single Input Multiple Output (SIMO) and Multiple Input Multiple Output (MIMO) communications in accordance with one or more selectable MISO, SISO, SIMO or MIMO modes of operation.

The wireless communication device 200 may be implemented using one or more integrated circuits (IC) and one or more substrates (e.g., printed circuit boards), where an IC includes one or more IC dies and an IC package. For example, the antenna processing circuit 210, the power amplifiers, and the low noise amplifiers may be implemented on the one or more IC dies and the antennas 212-1, etc., on an IC package substrate and/or one of the substrates. As another example, one or more of the baseband processing module 202, the receiver section 204, the transmitter section 206, and the processing module 214 may also be implemented on the one or more IC dies.

In particular, the wireless communication device 200 includes an integrated circuit with an antenna that is described, in conjunction with several optional functions and features, in conjunction with FIGS. 3-11 that follow.

Figure 3:
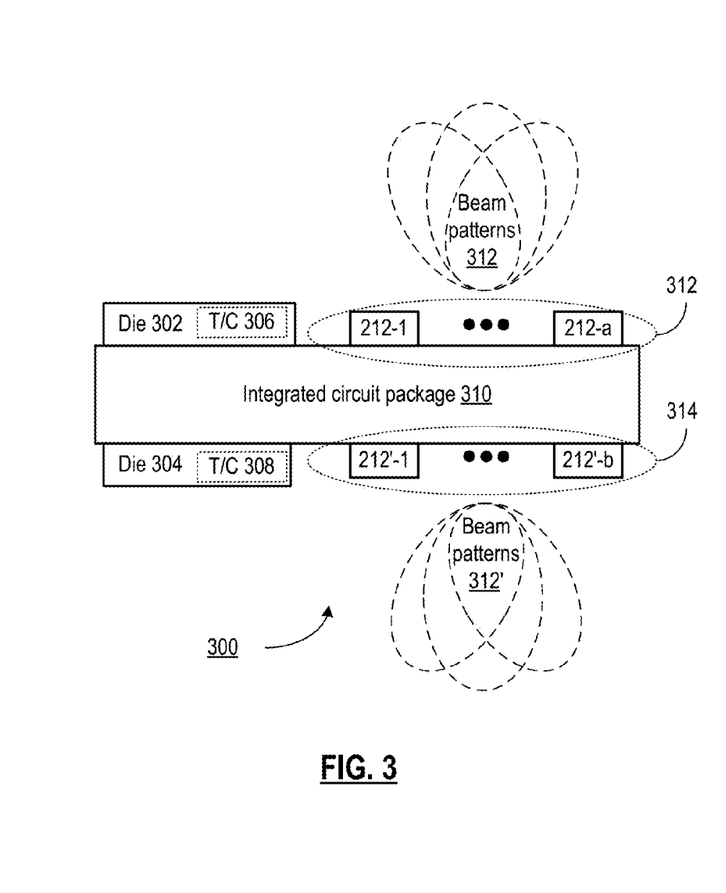
FIG. 3 is a diagram of an example of an integrated circuit in accordance with the present disclosure.

FIG. 3 is a diagram of an example of an integrated circuit in accordance with the present disclosure. In particular an integrated circuit 300 is shown in side view that includes a package 310. The dies 302 and 304 include transceiver circuitry (T/C) 306 and 308 that generates outbound signals that convey outbound data and that receives inbound signals that convey inbound data. In particular, dies 302 and 304 include can one or more components of wireless communication device 200, with the exclusion of the antennas (212-1 . . . 212-n) that are implemented separately. While the transceiver circuitry 306 and 308 is discussed as being implemented via two dies 302 and 304, a single die or three or more dies can be implemented in a similar fashion. Further, a one or dies can be included with only a subset of the transceiver circuitry of wireless device 200—such as only the antenna processing circuit 210, with remaining portions of the transceiver circuitry being implemented off-chip.

A first array of antenna elements (212-1 . . . 212-a) are arranged along a first portion of the package 314 and coupled to the transceiver circuitry 306 and/or 308 to transmit at least a first portion of the outbound signals as first wireless transmissions and/or to generate at least a first portion of the inbound signals from first wireless receptions. A second array of antenna elements is arranged along a second portion of the package 314 and coupled to the transceiver circuitry 306 and/or 308 to transmit at least a second portion of the outbound signals as second wireless transmissions and/or to generate at least a second portion of the inbound signals from second wireless receptions. In the embodiment shown, the first array of antenna elements (212-1 . . . 212-a) are arranged along the top portion of the package 310 and the second array of antenna elements (212'-1 . . . 212'-b) are arranged along the bottom portion of the package 310, however other configurations are likewise possible. While described above as top and bottom, it should be noted that these designations are not meant to be limiting or indicative of a particular orientation of the integrated circuit 300. One skilled in the art will realize that an integrated circuit can be implemented in any possible orientation and that most wireless communication devices themselves can be re-oriented as geometric solids with six degrees of freedom such as x, y, z, roll, pitch and yaw. In this context, top and bottom refer only to two opposing or substantially opposing sides of the package 310.

In an embodiment, $$n = a + b$$

Further, a and b can be either equal or unequal depending on the specific implementation. Each of the antenna elements (212-1 . . . 212-a) and (212'-1 . . . 212'-b) can be implemented via patch antennas, monopole antennas, dipole antennas, microstrip antennas, loop antennas, micro-machined horn antennas, slot antennas and/or other antenna configurations.

In an example, the array of antenna elements (212-1 . . . 212-a) and (212'-1 . . . 212'-b) can each form a linear array or a two-dimensional array in addition to implementing the other MIMO configurations. For example, the transceiver circuitry 306 or 308 can select a first proper subset of transmit antennas (TX) and a second proper subset of receive antennas (RX) from the superset containing all of the antenna elements (212-1 . . . 212-a) and (212'-1 . . . 212'-b). In this fashion, some of the antenna elements (212-1 . . . 212-a) and (212'-1 . . . 212'-b) can be selectively allocated to TX operation while others are selectively allocated to RX operation, depending on the particular MIMO mode of the wireless communication device 200. In one example of operation, the first proper subset of transmit antennas and the second proper subset of receive antennas have a null intersection—meaning that no antenna is allocated simultaneously to both TX and RX operation. Further, the first proper subset of transmit antennas and the second proper subset of receive antennas can individually include members from both the first array of antenna elements and the second array of antenna elements. In this fashion, TX antennas can include antenna elements from both the top and bottom of the package and while also RX antennas can include antenna elements from both the top and bottom of the package. Other configurations are likewise possible.

In addition, the transceiver circuitry 306 and/or 308 can also implement a controlled or steerable beam pattern for one or both of these antenna arrays. As shown, the array of antenna elements (212-1 . . . 212-*a*) can be controlled to any of a plurality of beam patterns 312 and the array of antenna elements (212'-1 . . . 212'-*b*) can be controlled to any of a plurality of beam patterns 312'. The arrays of antenna elements (212-1 . . . 212-*a*) and (212'-1 . . . 212'-*b*) collectively form a bidirectional antenna array that is capable of radiating and scanning both upward and downward—in the present orientation of the integrated circuit 300. In the examples shown, the first array of antenna elements (212-1 . . . 212-*a*) has directional beam patterns 312 that point away from the top portion of the package 310 and the second array of antenna elements has directional beam pattern 312' that points away from the bottom portion of the package 310. This can be useful in an implementation, for example, where the integrated circuit 300 is included in a wireless communication device such that the directional beam patterns 312 and the directional beam pattern 312' are aligned on opposite sides of the wireless communication device—such as front and back or other opposing or substantially opposing sides.

It should be noted that the dimensions of the integrated circuit 300 and its components are not shown to scale. Further, the integrated circuit can include one or more wires, balls, pads, pins, a coaxial cable, a connector or other interface (either wired or wireless, serial or parallel), for coupling the integrated circuit 300 to a printed circuit board or otherwise to one or more other devices. In addition, the beam patterns 310 and 310' are presented in two, rather than three dimensions and merely illustrate radiation and scanning patterns and do not necessarily represent any particular beam pattern or patterns.

Figure 4:
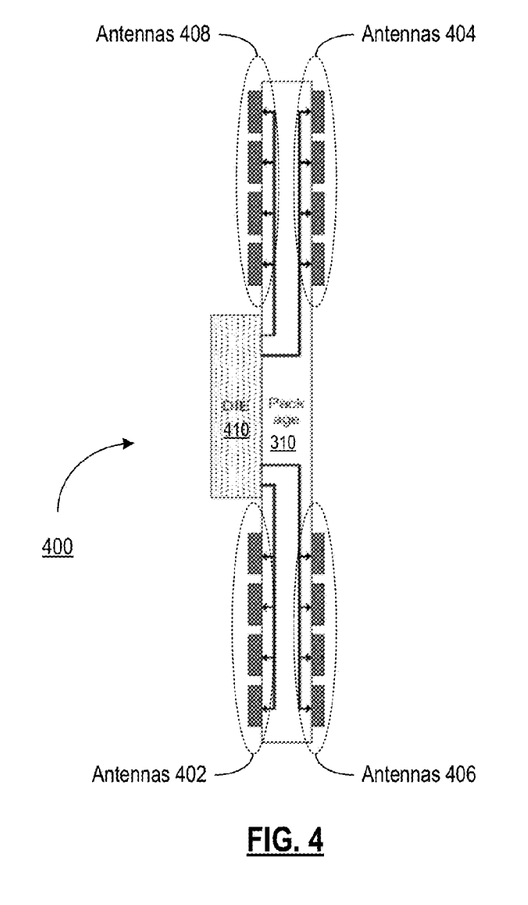
FIG. 4 is a diagram of another example of an integrated circuit in accordance with the present disclosure.

FIG. 4 is a diagram of another example of an integrated circuit in accordance with the present disclosure. In the example, the package 310 includes a single die 410 that includes some or all of the transceiver circuitry presented in conjunction with FIG. 2. The term "package" in this context we refer to a PCB-like substrate which can have better mechanical/thermal/electrical properties than regular PCB, and can be the substrate on which the die sits (e.g. a flip chip or other configuration).

The antennas 402, 404, 406 and 408 in four different arrays can collectively form a bidirectional antenna array that is capable of radiating and scanning in the front and back of the package 310 (left and right, respectively, in the orientation of the integrated circuit 400 that is shown). The antennas 402, 404, 406 and 408 are shown as incorporated using a single package 310 that further includes a single die 410. The single die 410 can include the antenna processing circuit 210 (shown in FIG. 2) having, for example, a phase shifter, an antenna tuning circuit, impedance matching circuit, etc.). This configuration assumes that the package is not mounted on a PCB (for example, there is no PCB, or that the connection to the PCB is done through a coaxial cable or other wired or wireless connection).

This configuration could be used in a wide variety of applications. For example, the configuration is used for T4 (dual polarized shared TRX), T3 (shared TRX), or T2 (separated TX RX) applications. As another example, the configuration is used for T2 where 8 antennas are facing front with TX, 8 antennas are facing back with TX, 8 antennas are facing front with RX, and 8 antennas are facing back with RX. As a further example, the configuration is used for T4 where 8 antennas are facing front with TRX, 8 antennas are facing back with TRX.

Figure 5:
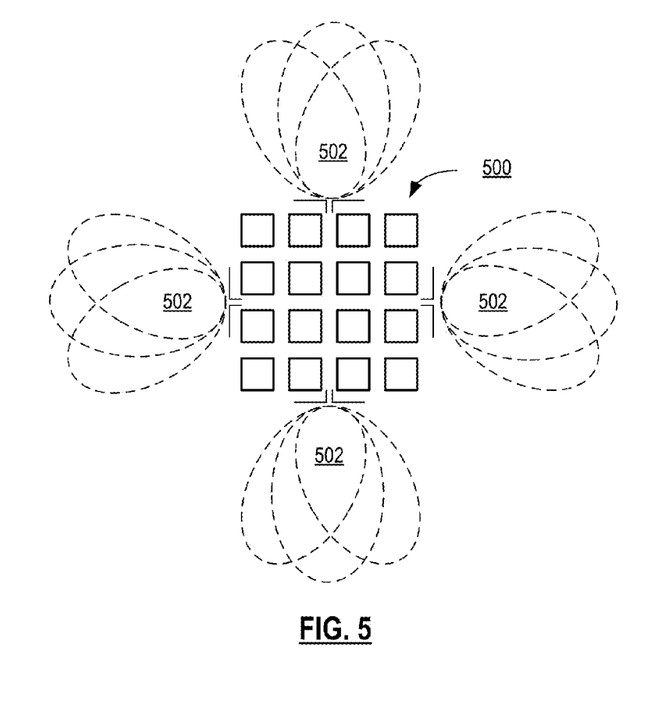
FIG. 5 is a diagram of an example of an antenna in accordance with the present disclosure.

FIG. 5 is a diagram of an example of an antenna in accordance with the present disclosure. The antenna 500 includes a two-dimensional array of antenna elements capable of radiating and scanning in multiple directions in the plane of array including broadside and end-fire directions 502 and other directions not specifically shown. The antenna array 500 can represent the array of antenna elements (212-1 . . . 212-*a*) or (212'-1 . . . 212'-*b*) presented in conjunction with FIG. 3, the antennas 402, 404, 406 or 408 presented in conjunction with FIG. 4 or other configuration of a single chip and package that could be used in conjunction with a wireless communication device. As shown, the antenna array includes 16 patch antennas radiating broadside (with scanning capabilities) and with four dipoles radiating along the end-fire direction of the package, to broaden the coverage of the array in the broadside and end-fire directions 502.

Figure 6:
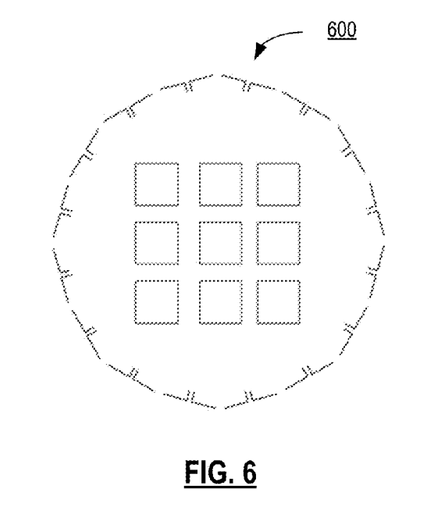
FIG. 6 is a diagram of an example of an antenna in accordance with the present disclosure.

FIG. 6 is a diagram of an example of an antenna in accordance with the present disclosure. The antenna 600 includes a two-dimensional array of nine patch antennas radiating broadside (with scanning capabilities) and with several dipoles encircling the patch antennas. The dipole antennas radiate (with scanning capabilities) along the end-fire direction of the package in many radial directions, which broadens the coverage of the array. The antenna array 600 can represent the array of antenna elements (212-1 . . . 212-*a*) or (212'-1 . . . 212'-*b*) presented in conjunction with FIG. 3, the antennas 402, 404, 406 or 408 presented in conjunction with FIG. 4 or other configuration of a single chip and package that could be used in conjunction with a wireless communication device.

Figure 7:
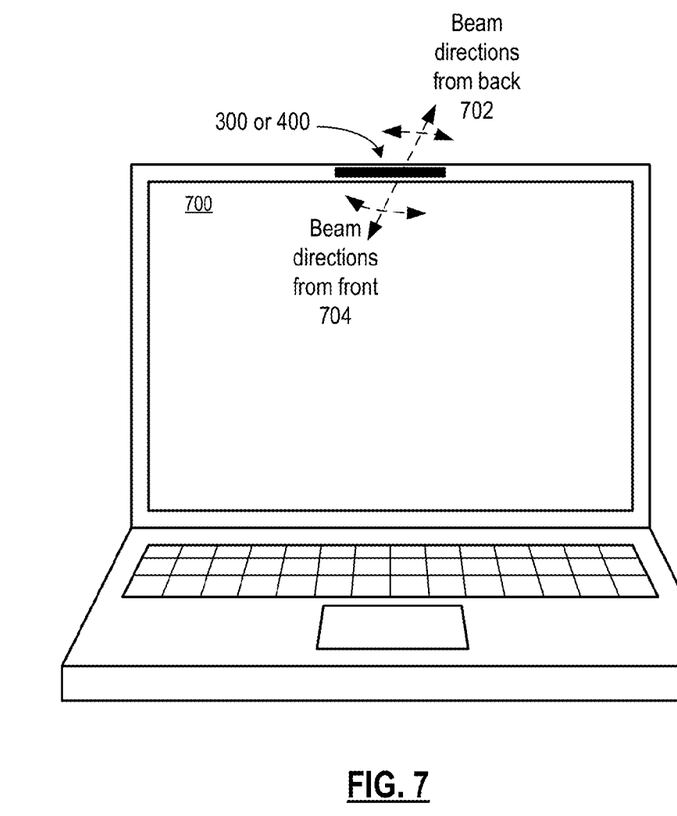
FIG. 7 is a diagram of an example of a communication device with a placement of an antenna in accordance with the present disclosure.

FIG. 7 is a diagram of an example of a communication device with a placement of an antenna in accordance with the present disclosure. As shown, a laptop computer 700 includes an integrated circuit 300 or 400 mounted on the top of the screen to provide radiation patterns that include beam directions from the back 702 and beam directions from the front 704. While the arrows shown indicate a particular direction and a range about that direction, it should be noted that beam directions to the front 704 and to the back 702 include, respectively, the hemisphere of possible directions to the front and the hemisphere of possible directions to the back. Providing beam patterns to the front and back of the laptop 700 provides greater coverage for communications with other devices in proximity to the laptop such as network access devices, peer to peer communication with other laptops, smartphones, tablets, and other peer devices and peripheral devices, such as printers, speakers, etc.

In addition, the integrated circuit 300 or 400 can provide a usable beam pattern even when the laptop is closed. For example, device feedback from the laptop indicating closure can be used by transceiver circuitry included in or associated with the integrated circuit 300 or 400 to change the RX and TX designations of the antenna to rely exclusively on the antenna elements that produce beam directions from the back 702.

Figure 8:
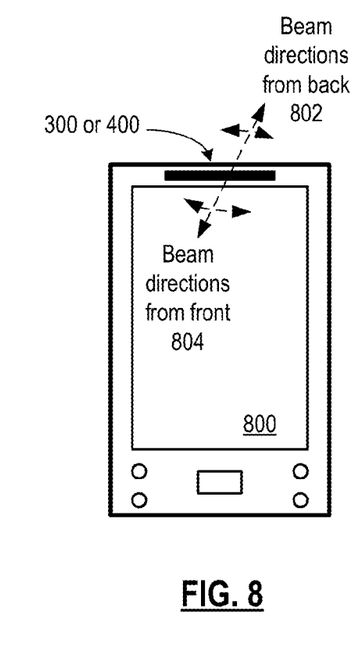
FIG. 8 is a diagram of another example of a communication device with a placement of an antenna in accordance with the present disclosure.

FIG. 8 is a diagram of another example of a communication device with a placement of an antenna in accordance with the present disclosure. As shown, a smartphone 800 includes an integrated circuit 300 or 400 mounted on the top of the screen to provide radiation patterns that include beam directions from the back 802 and beam directions from the front 804. While the arrows shown indicate a particular direction and a range about that direction, it should be noted that beam directions to the front 804 and to the back 802 include, respectively, the hemisphere of possible directions to the front and the hemisphere of possible directions to the back. Providing beam patterns to the front and back of the smartphone 800 provides greater coverage for communications with other devices in proximity to the laptop such as network access devices, peer to peer communication with other laptops, smartphones, tablets, and other peer devices and peripheral devices, such as printers, speakers, etc.

In addition, the integrated circuit 300 or 400 can provide a usable beam pattern even when the smartphone 800 is laid down on a surface with the screen facing up or the screen facing down. For example, communication feedback from the transceiver circuitry can indicate that communications in either the front or back direction are blocked. The transceiver circuitry included in or associated with the integrated circuit 300 or 400 can respond by changing the RX and TX designations of the antenna to rely exclusively on the antenna elements that produce beam directions from the back 802 or front 804, depending on the which communications are blocked.

Figure 9:
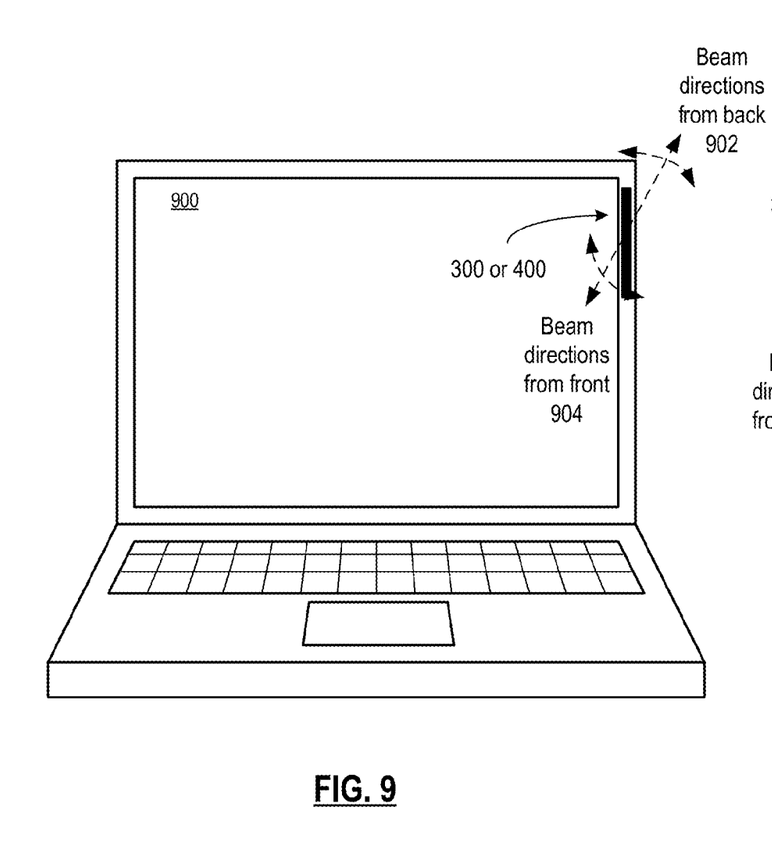
FIG. 9 is a diagram of another example of a communication device with a placement of an antenna in accordance with the present disclosure.

FIG. 9 is a diagram of another example of a communication device with a placement of an antenna in accordance with the present disclosure. As shown, a laptop computer 900 includes an integrated circuit 300 or 400 mounted on the side of the screen to provide radiation patterns that include beam directions from the back 902 and beam directions from the front 904. While the arrows shown indicate a particular direction and a range about that direction, it should be noted that beam directions to the front 904 and to the back 902 include, respectively, the hemisphere of possible directions to the front and the hemisphere of possible directions to the back. Providing beam patterns to the front and back of the laptop 900 provides greater coverage for communications with other devices in proximity to the laptop such as network access devices, peer to peer communication with other laptops, smartphones, tablets, and other peer devices and peripheral devices, such as printers, speakers, etc.

In addition, the integrated circuit 300 or 400 can provide a usable beam pattern even when the laptop is closed. For example, device feedback from the laptop indicating closure can be used by transceiver circuitry included in or associated with the integrated circuit 300 or 400 to change the RX and TX designations of the antenna to rely exclusively on the antenna elements that produce beam directions from the back 902.

Figure 10:
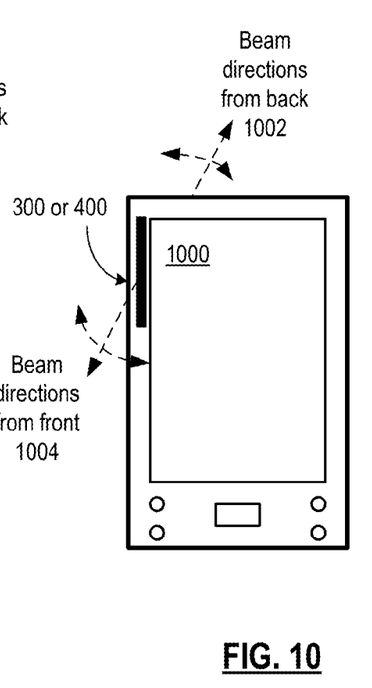
FIG. 10 is a diagram of another example of a communication device with a placement of an antenna in accordance with the present disclosure.

FIG. 10 is a diagram of another example of a communication device with a placement of an antenna in accordance with the present disclosure. As shown, a smartphone 1000 includes an integrated circuit 300 or 400 mounted on the side of the screen to provide radiation patterns that include beam directions from the back 1002 and beam directions from the front 1004. While the arrows shown indicate a particular direction and a range about that direction, it should be noted that beam directions to the front 1004 and to the back 1002 include, respectively, the hemisphere of possible directions to the front and the hemisphere of possible directions to the back. Providing beam patterns to the front and back of the smartphone 1000 provides greater coverage for communications with other devices in proximity to the laptop such as network access devices, peer to peer communication with other laptops, smartphones, tablets, and other peer devices and peripheral devices, such as printers, speakers, etc.

In addition, the integrated circuit 300 or 400 can provide a usable beam pattern even when the smartphone 1000 is laid down on a surface with the screen facing up or the screen facing down. For example, communication feedback from the transceiver circuitry can indicate that communications in either the front or back direction are blocked. The transceiver circuitry included in or associated with the integrated circuit 300 or 400 can respond by changing the RX and TX designations of the antenna to rely exclusively on the antenna elements that produce beam directions from the back 1002 or front 1004, depending on the which communications are blocked.

Figure 11:
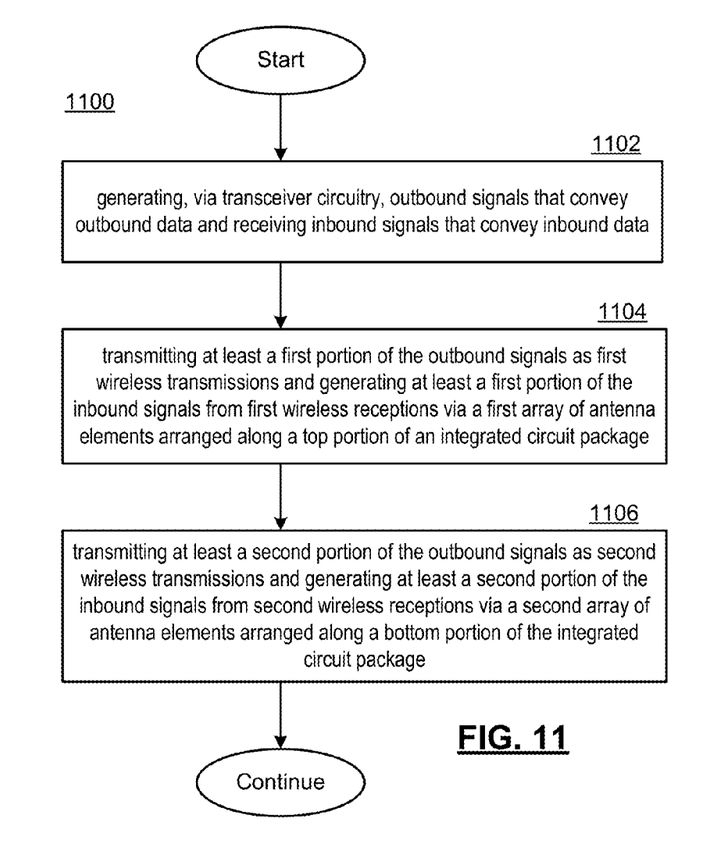
FIG. 11 is a flow diagram of a method in accordance with the present disclosure.

FIG. 11 is a flow diagram of a method in accordance with the present disclosure. In particular, a method 1100 is shown for use in conjunction with one or more functions and features described in conjunction with FIGS. 1-10. Step 1102 includes generating, via transceiver circuitry, outbound signals that convey outbound data and receiving inbound signals that convey inbound data. Step 1104 includes transmitting at least a first portion of the outbound signals as first wireless transmissions and generating at least a first portion of the inbound signals from first wireless receptions via a first array of antenna elements arranged along the top portion of an integrated circuit package. Step 1106 includes transmitting at least a second portion of the outbound signals as second wireless transmissions and generating at least a second portion of the inbound signals from second wireless receptions via a second array of antenna elements arranged along the bottom portion of the integrated circuit package.

In an example, at least one of, the first array of antenna elements or the second array of antenna elements, is a linear array. The method can further include steering a beam pattern at least one of, the first array of antenna elements or the second array of antenna elements. The first array and/or second array of antenna elements can be a two-dimensional array with a controllable beam pattern. The method can further include selecting a first proper subset of transmit antennas and a second proper subset of receive antennas from the superset containing both the first array of antenna elements and the second array of antenna elements. The first proper subset of transmit antennas and the second proper subset of receive antennas can have a null intersection. The first proper subset of transmit antennas and the second proper subset of receive antennas can each individually include members from both the first array of antenna elements and the second array of antenna elements. The first array of antenna elements can have a first directional beam pattern that points away from the top portion of the package and the second array of antenna elements can have a second directional beam pattern that points away from the bottom portion of the package.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more examples have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more examples are used herein to illustrate one or more aspects, one or more features, one or more concepts, and/or one or more examples. A physical example of an apparatus, an article of manufacture, a machine, and/or of a process may include one or more of the aspects, features, concepts, examples, etc. described with reference to one or more of the examples discussed herein. Further, from figure to figure, the examples may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the examples. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

While particular combinations of various functions and features of the one or more examples have been expressly described herein, other combinations of these features and functions are likewise possible. The present disclosure is not limited by the particular examples disclosed herein and expressly incorporates these other combinations.

What is claimed is:

1. An integrated circuit comprising:
   a package having a top portion on a first surface of a package and a bottom portion on a second surface of the package that is on an opposite side of the package from the first surface;
   a least one die supported by the package that includes transceiver circuitry that generates outbound signals that convey outbound data and that receives inbound signals that convey inbound data;
   a first array of antenna elements arranged along the top portion of the package that operate in conjunction with the transceiver circuitry to at least one of: transmit at least a first portion of the outbound signals as first wireless transmissions, or generate at least a first portion of the inbound signals from first wireless receptions; and
   a second array of antenna elements arranged along the bottom portion of the package that operate in conjunction with the transceiver circuitry to at least one of: transmit at least a second portion of the outbound signals as second wireless transmissions, or to generate at least a second portion of the inbound signals from second wireless receptions, wherein transceiver circuitry selects a first proper subset of transmit antennas and a second proper subset of receive antennas from a superset containing both the first array of antenna elements and the second array of antenna elements and wherein the first proper subset of transmit antennas and the second proper subset of receive antennas have a null intersection and wherein the first proper subset of transmit antennas and the second proper subset of receive antennas individually include members from both the first array of antenna elements and the second array of antenna elements.

2. The integrated circuit of claim 1 wherein at least one of, the first array of antenna elements or the second array of antenna elements, is a linear array.

3. The integrated circuit of claim 1 wherein at least one of, the first array of antenna elements or the second array of antenna elements, has a steerable beam pattern.

4. The integrated circuit of claim 1 wherein the first array of antenna elements is a two-dimensional array with a controllable beam pattern.

5. The integrated circuit of claim 1 wherein the second array of antenna elements is a two-dimensional array with a controllable beam pattern.

6. The integrated circuit of claim 1 wherein the first array of antenna elements includes at least one of: a plurality of patch antennas, a plurality of monopole antennas, a plurality of dipole antennas, a plurality of microstrip antennas, a plurality of loop antennas, a plurality of micro-machined horn antennas, or a plurality of slot antennas.

7. The integrated circuit of claim 1 wherein the first array of antenna elements has a first directional beam pattern that points away from the top portion of the package and the second array of antenna elements has a second directional beam pattern that points away from the bottom portion of the package.

8. The integrated circuit of claim 7 wherein the integrated circuit is implemented in a communication device such that the first directional beam pattern and the second directional beam pattern are aligned with opposite sides of the communication device.

9. A method comprising:
   generating, via transceiver circuitry, outbound signals that convey outbound data and receiving inbound signals that convey inbound data;
   transmitting at least a first portion of the outbound signals as first wireless transmissions and generating at least a first portion of the inbound signals from first wireless receptions via a first array of antenna elements arranged along a top portion of an integrated circuit package;
   transmitting at least a second portion of the outbound signals as second wireless transmissions and generating at least a second portion of the inbound signals from second wireless receptions via a second array of antenna elements arranged along a bottom portion of the integrated circuit package, wherein the top portion is on a first surface of a package and the bottom portion on a second surface of the package that is on an opposite side of the package from the first surface; and
   selecting a first proper subset of transmit antennas and a second proper subset of receive antennas from a superset containing both the first array of antenna elements and the second array of antenna elements and wherein the first proper subset of transmit antennas and the second proper subset of receive antennas have a null intersection and wherein the first proper subset of transmit antennas and the second proper subset of receive antennas individually include members from both the first array of antenna elements and the second array of antenna element.

10. The method of claim 9 wherein at least one of, the first array of antenna elements or the second array of antenna elements, is a linear array.

11. The method of claim 9 further comprising:
   steering a beam pattern at least one of, the first array of antenna elements or the second array of antenna elements.

12. The method of claim 9 wherein the first array of antenna elements is a two-dimensional array with a controllable beam pattern.

13. The method of claim 9 wherein the second array of antenna elements is a two-dimensional array with a controllable beam pattern.

14. The method of claim 9 wherein the first array of antenna elements has a first directional beam pattern that points away from the top portion of the package and the second array of antenna elements has a second directional beam pattern that points away from the bottom portion of the package.

15. An integrated circuit comprising:
   a package;
   a single die supported by the package that includes transceiver circuitry that generates outbound signals that convey outbound data and that receives inbound signals that convey inbound data;

a first array of antenna elements arranged along a first portion of the package and coupled to the transceiver circuitry to transmit at least a first portion of the outbound signals as first wireless transmissions and to generate at least a first portion of the inbound signals from first wireless receptions; and a second array of antenna elements arranged along a second portion of the package and coupled to the transceiver circuitry to transmit at least a second portion of the outbound signals as second wireless transmissions and to generate at least a second portion of the inbound signals from second wireless receptions, wherein the first portion is on a first surface of a package and the second portion on a second surface of the package that is on an opposite side of the package from the first surface, wherein transceiver circuitry selects a first proper subset of transmit antennas and a second proper subset of receive antennas from a superset containing both the first array of antenna elements and the second array of antenna elements and wherein the first proper subset of transmit antennas and the second proper subset of receive antennas have a null intersection and wherein the first proper subset of transmit antennas and the second proper subset of receive antennas individually include members from both the first array of antenna elements and the second array of antenna elements.

16. The integrated circuit of claim 15 wherein the first array of antenna elements is arranged along a top portion of the package and the second array of antenna elements is arranged along a bottom portion of the package.

17. The integrated circuit of claim 15 wherein at least one of, the first array of antenna elements or the second array of antenna elements, is a linear array.

18. The integrated circuit of claim 15 wherein at least one of, the first array of antenna elements or the second array of antenna elements, has a steerable beam pattern.

19. The integrated circuit of claim 15 wherein the first array of antenna elements is a two-dimensional array with a controllable beam pattern.

20. The integrated circuit of claim 15 wherein the second array of antenna elements is a two-dimensional array with a controllable beam pattern.

* * * * *